United States Patent [19]
Barry et al.

[11] Patent Number: 6,034,598
[45] Date of Patent: Mar. 7, 2000

[54] HAZARD WARNING SWITCH FOR MOTOR VEHICLES

[75] Inventors: Stephen William Barry, Cirencester; Reginald Jeffrey Collings, Winchcombe, both of United Kingdom

[73] Assignee: Delta Schoeller, Ltd., United Kingdom

[21] Appl. No.: 08/740,493

[22] Filed: Oct. 30, 1996

[30] Foreign Application Priority Data

Jul. 19, 1996 [GB] United Kingdom .................... 9615164
Aug. 28, 1996 [GB] United Kingdom .................... 9617966

[51] Int. Cl.[7] ................................................... B60Q 1/52
[52] U.S. Cl. ............................................................ 340/471
[58] Field of Search ................................. 340/471; 29/2; 200/5 B, 158, 1 V

[56] References Cited

U.S. PATENT DOCUMENTS

| | | | |
|---|---|---|---|
| 3,846,879 | 11/1974 | Jenkins | 29/2 |
| 3,944,765 | 3/1976 | Kawai et al. | 340/471 |
| 4,227,174 | 10/1980 | Belcher et al. | 340/471 |
| 4,639,566 | 1/1987 | De Haitre | 200/158 |
| 4,893,111 | 1/1990 | Roller | 340/471 |
| 5,084,598 | 1/1992 | Magata et al. | 200/1 V |
| 5,187,335 | 2/1993 | Fukuyama et al. | 200/5 B |
| 5,309,142 | 5/1994 | Fritz | 340/471 |

Primary Examiner—Jeffery A. Hofsass
Assistant Examiner—John Tweel, Jr.

[57] ABSTRACT

An electrical circuit, comprising:

at least one conductive pressing, inset moulded in an insulating plastics support, the pressing(s) providing an electrical circuit on which is mounted at least one surface mounted electronic component, and connector terminals to provide electrical power to the circuit and one or more electrical inputs to and/or one or more electrical outputs from the circuit.

19 Claims, 7 Drawing Sheets

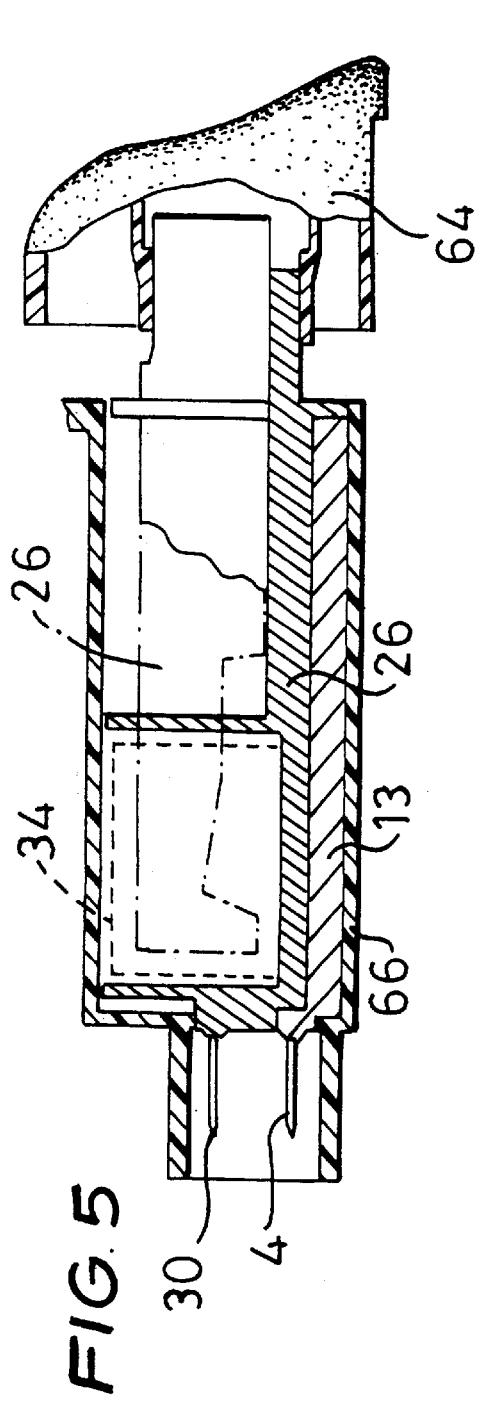
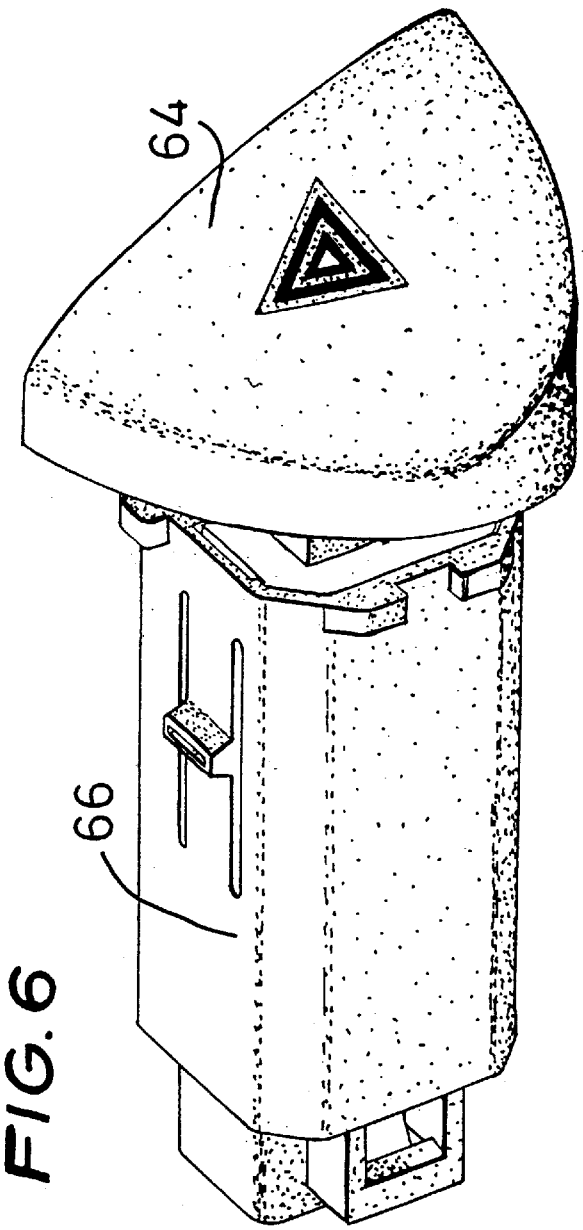
FIG. 5
FIG. 6

HAZARD WARNING SWITCH FOR MOTOR VEHICLES

This invention relates to electrical circuits. A particular application of the invention is to hazard warning and indicator units for motor vehicles although it has more general applicability.

In a conventional use of surface mount components, these are soldered to a printed circuit board and then the printed circuit board is connected to other components and terminals by additional means such as secondary soldering operations or mechanical means such as riveting or sprung connections. This produces several joints which are potential failure points, which can fail immediately or deteriorate over a period of time due to loosening or build up of oxide films between the parts of the joints. Each connection has to be manufactured and requires components, tooling, and time in the manufacturing process.

Against this background, one aspect of the invention provides an electrical circuit, comprising:

at least one conductive pressing, inset moulded in an insulating plastics support, the pressing(s) providing an electrical circuit on which is mounted at least one surface mounted electronic component, and connector terminals to provide electrical power to the circuit and one or more electrical inputs to and/or one or more electrical outputs from the circuit.

This aspect of the invention also extends to a method of manufacturing an electrical circuit, comprising:

making at least one conductive pressing, inset moulding the pressing in an insulating plastics support, parting at least one area of the pressing from an adjoining area and mounting a surface mounted electronic component on the pressing in order to create an operative electrical circuit in which the pressing provides connector terminals to provide electrical power to the circuit and one or more electrical inputs to and/or one or more electrical outputs from the circuit.

Flasher control units for motor vehicles are too bulky to combine with their switches and are normally located in the fuse box. This necessitates connection between the unit and both the direction indicator switches and the hazard warning switches through the vehicle's wiring loom. Inside the control unit connections have to be made between the unit's terminals and the printed circuit board on which the control circuit is built. It is becoming increasingly difficult to find sufficient space in the fuse box for the control unit.

Against this background, in accordance with another aspect of the invention there is provided a hazard warning switch for motor vehicles, having at least one conductive pressing, inset moulded in an insulating plastics support, the pressing(s) providing an electrical circuit on which are mounted circuit components of a combined hazard and flasher control unit, connector terminals for connection to terminals in the vehicle, to provide electrical power to the switch;

electrical connections to operate the indicators on one side or other of the vehicle controlled by indicator switch; and connections to hazard warning switch contacts to operate the indicators on both sides of the vehicle as a hazard warning.

The number of connections required is reduced by use of such an arrangement. The flasher control unit is removed from the fuse box.

The pressing also preferably provides switch contacts.

In the form presently preferred, the connector terminals also provide connections to a separate indicator switch.

In a conventional flasher control unit, a surface mounted integrated circuit is mounted on a printed circuit board. In a preferred form of the invention, the said components include a such surface mounted integrated circuit.

This aspect of the invention also extends to a method of manufacturing a hazard warning switch for motor vehicles, comprising:

making at least one pressing from conductive material;

inset moulding an insulating support round the pressing leaving exposed areas of the pressing to provide connector terminals for connection to terminals in the vehicle, to provide electrical power to the switch from the loom;

electrical connections to operate the indicators on one side or other of the vehicle controlled by an indicator switch; and connections to hazard warning switch contacts to operate the indicators on both sides of the vehicle as a hazard warning;

parting at least one area of the pressing from an adjoining area; and mounting circuit components of a combined hazard and flasher control unit on the pressing in order to create an operative combined hazard and direction indicator control circuit.

In conventional switch structures incorporating pressings supported by insulating mouldings, the pressing is produced with all of what will become separate conductors temporarily joined by bridges so that the pressing is integral and will not fall apart into what will be its separate parts. After the pressing is inset moulded in a insulating support structure, the conductors are separated by a further pressing step which severs the bridges. It is not possible to sever the bridges by such a pressing step in the vicinity of which a surface mounted integrated circuit is to be fitted because the circuit connections thereto are too delicate and the step of severing by pressing distorts the circuit. Further the hole in the insulating moulding needs to be rather large to accommodate the press tool. In a preferred method the step is performed adjacent a position where a surface mounted integrated circuit is to be fitted, by laser cutting.

Another alternative or additional preferred step in the method is to coat exposed areas of the pressing with solder paste, to locate leads of circuit components on the solder pasted areas, and to bond the leads to the pressing with a point reflow tool.

In an alternative said step of mounting is performed with a conductive adhesive.

In other alternatives the surface mounted component is bonded to the inset moulding, and the leads of the component are soldered to the electrical circuit using a micro soldering tool, having a recirculating ball or fountain of molten solder or a micro flame.

One embodiment of the invention, given by way of example, will now be described with reference to the accompanying drawings, in which:

FIG. 5 is a general cross section showing the units of FIG. 3 assembled;

FIG. 6 is a pictorial view of the complete assembly of the flasher unit and hazard warning switch of the previous Figures in its housing;

Figure 1:
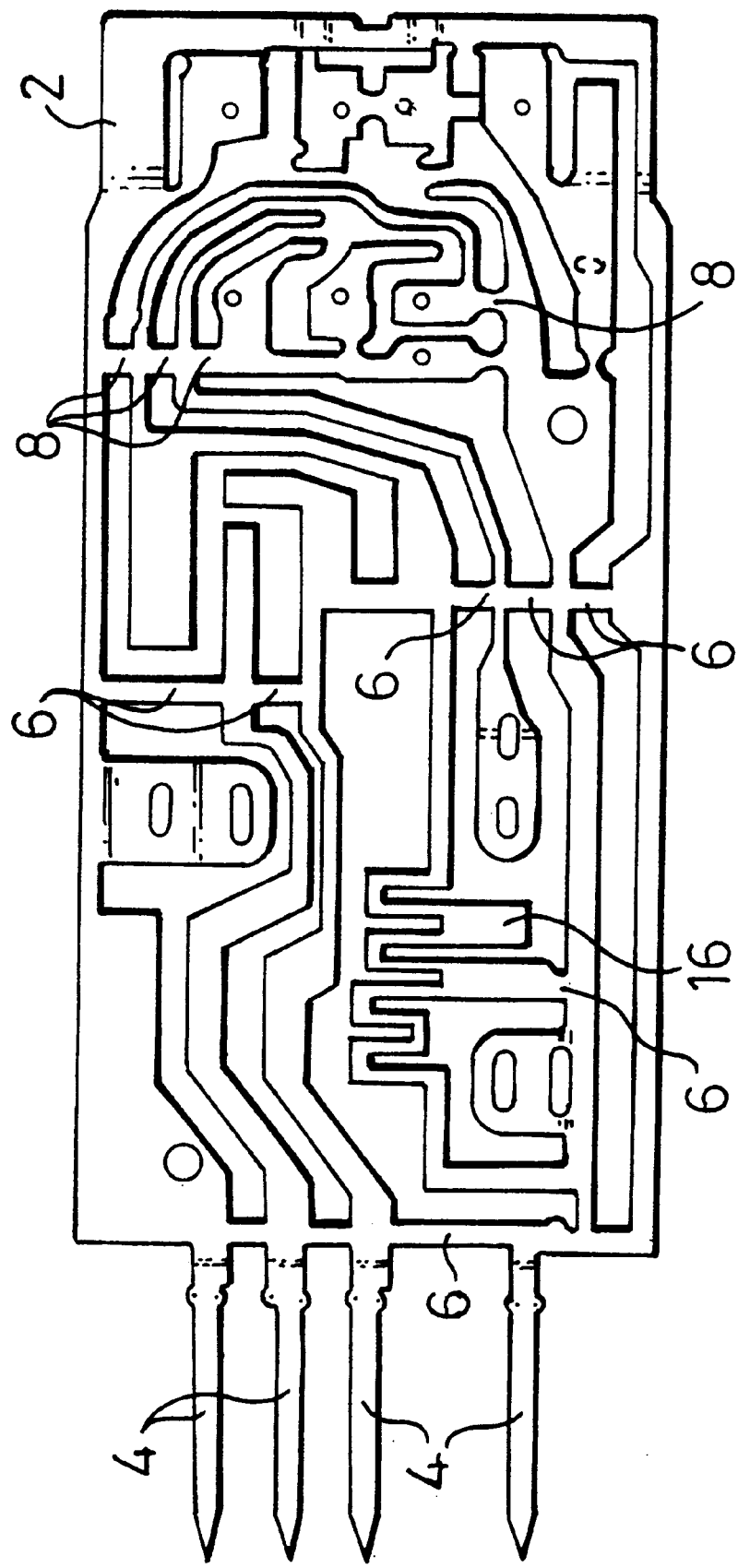
FIG. 1 is a plan view of a pressing for a combined flasher unit and hazard warning switch embodying the invention.

FIG. 1 shows a pressing 2 from copper sheet or copper alloy e.g. brass which is subsequently silver plated. Male connectors 4 project from one end to be received by female connectors in a vehicle's wiring loom. The pressing 2 remains in one integral piece at this stage. Thus, for example there are bridges 6 connecting the male connectors 4 and other parts mechanically and, as a result, also electrically. There are also bridges 8 adjacent a position where a surface mounted integrated circuit will be mounted subsequently. If these bridges were not present, what will become separate parts of the pressing would fall apart.

Figure 2:
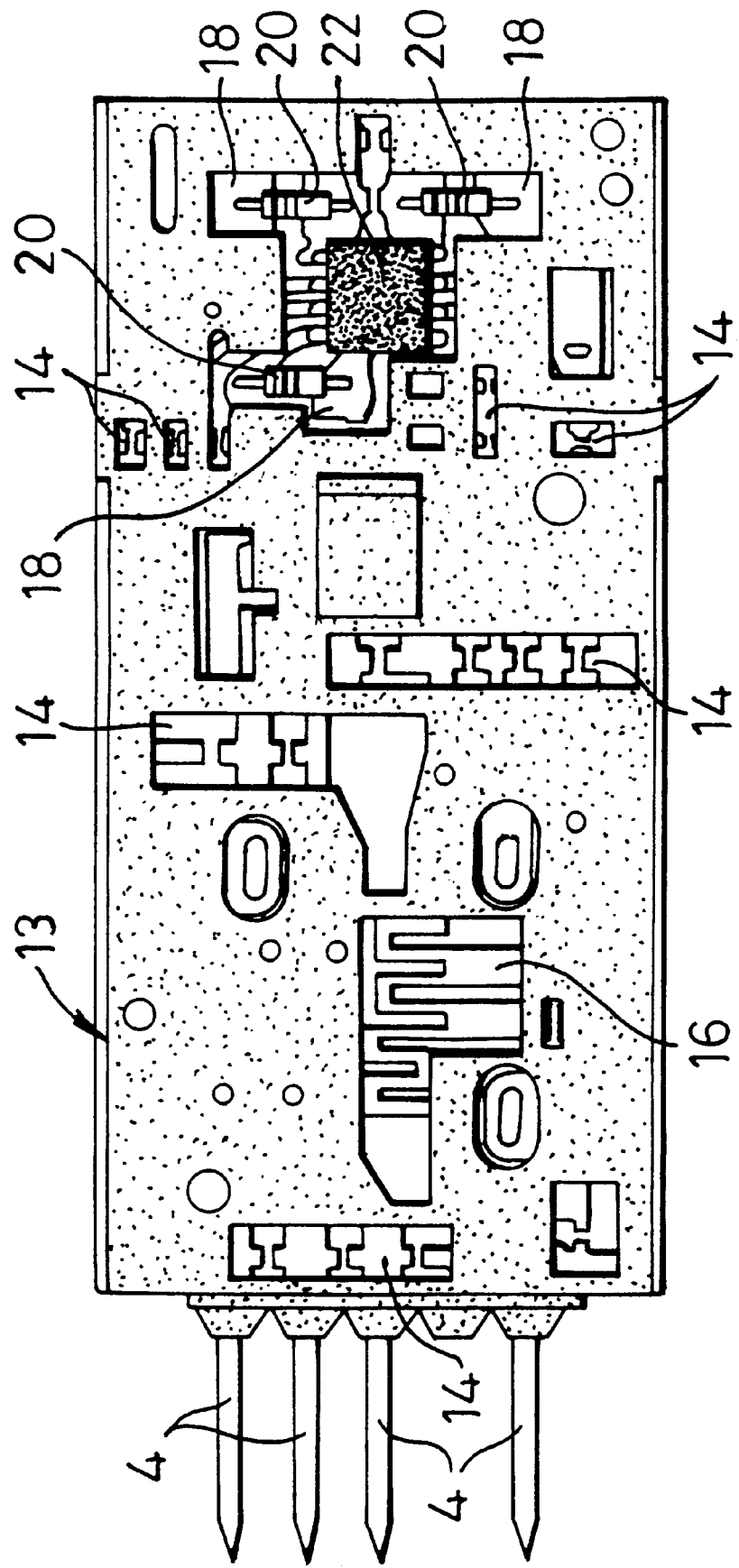
FIG. 2 is a plan view of a circuit comprising the pressing of FIG. 1 after inset moulding in an insulative support structure and after circuit components have been assembled thereon.

In FIG. 2 the pressing is shown after it has been inset moulded in an insulating support structure 12 and circuit components have been assembled thereon to complete a circuit unit 13. Areas of the pressing are left exposed by various apertures 14 in the moulding 12 in positions where it is necessary to break electrical bridges to form an operative electrical circuit by separating conductors from each other. Another area 16 comprises a low value current sensing resistive track and is left exposed to allow for adequate cooling. Yet other areas 18 are left exposed to allow circuit components to be mounted.

In order to make an operative circuit, the bridges 6 and 8 must be severed. The bridges 6 are severed conventionally using a further pressing step. In the region of the circuit components 20 and 22, however, this would distort the circuit so that the surface mounted component could not be mounted thereon. A conventional pressing step would not operate sufficiently finely to sever the bridges 8 and the hole in the inset moulding through which they are exposed would need to be larger supporting the circuit less and rendering it more liable to distortion. The bridges 8 are therefore severed using a laser cutter.

Circuit components shown in FIG. 2 comprise three miniature resistors 20 and a surface mounted integrated flasher control circuit 22. In conventional flasher control unit constructions, such components would be mounted on a printed circuit board by one of two process. In one process the components are attached by adhesive, the board is inverted and passed over a wave of solder in a flow soldering process. In the other process the components are attached with solder paste which is then reflowed in an oven. In the present construction the areas of pressing to which the components are to be mounted are coated with solder paste. The components are then placed on the pressing where the solder paste holds them sufficiently firmly for the assembly to be handled. The solder is then flowed to permanently bond the components electrically to the pressing using a point reflow tool.

Figure 3:
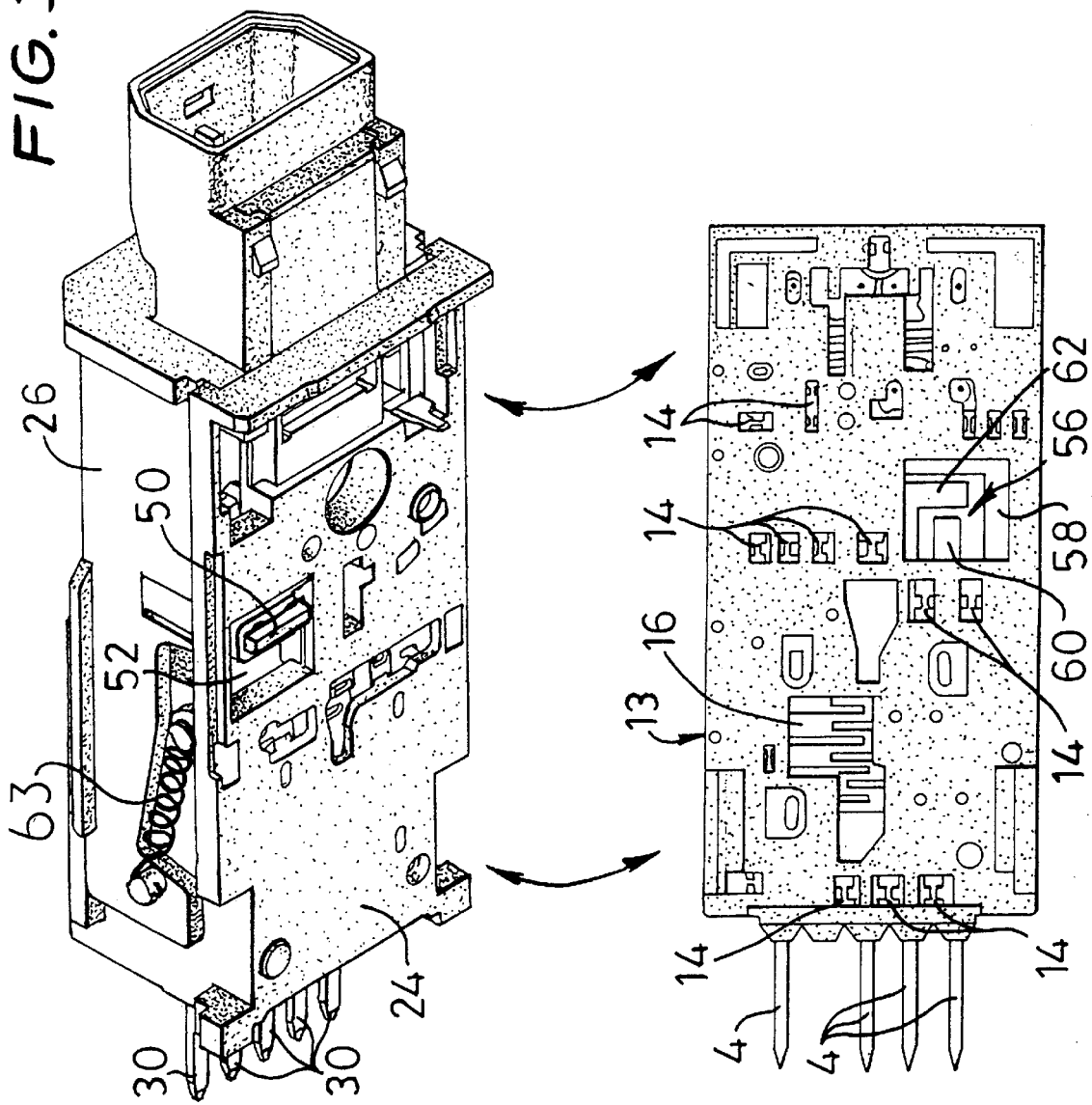
FIG. 3 is a part pictorial view of two units of a combined flasher unit and hazard warning switch, embodying the invention, shown with a third unit exploded.

FIG. 3 shows how the circuit unit 13 of FIG. 2 is assembled with a second circuit unit 24 and a contact carrier 26. The contact carrier 26 is slidably mounted on the unit 24 which is assembled fixedly with the unit 13. The circuit unit 24 is constructed in a similar fashion to the construction of the circuit unit 13 described above.

Figure 7:
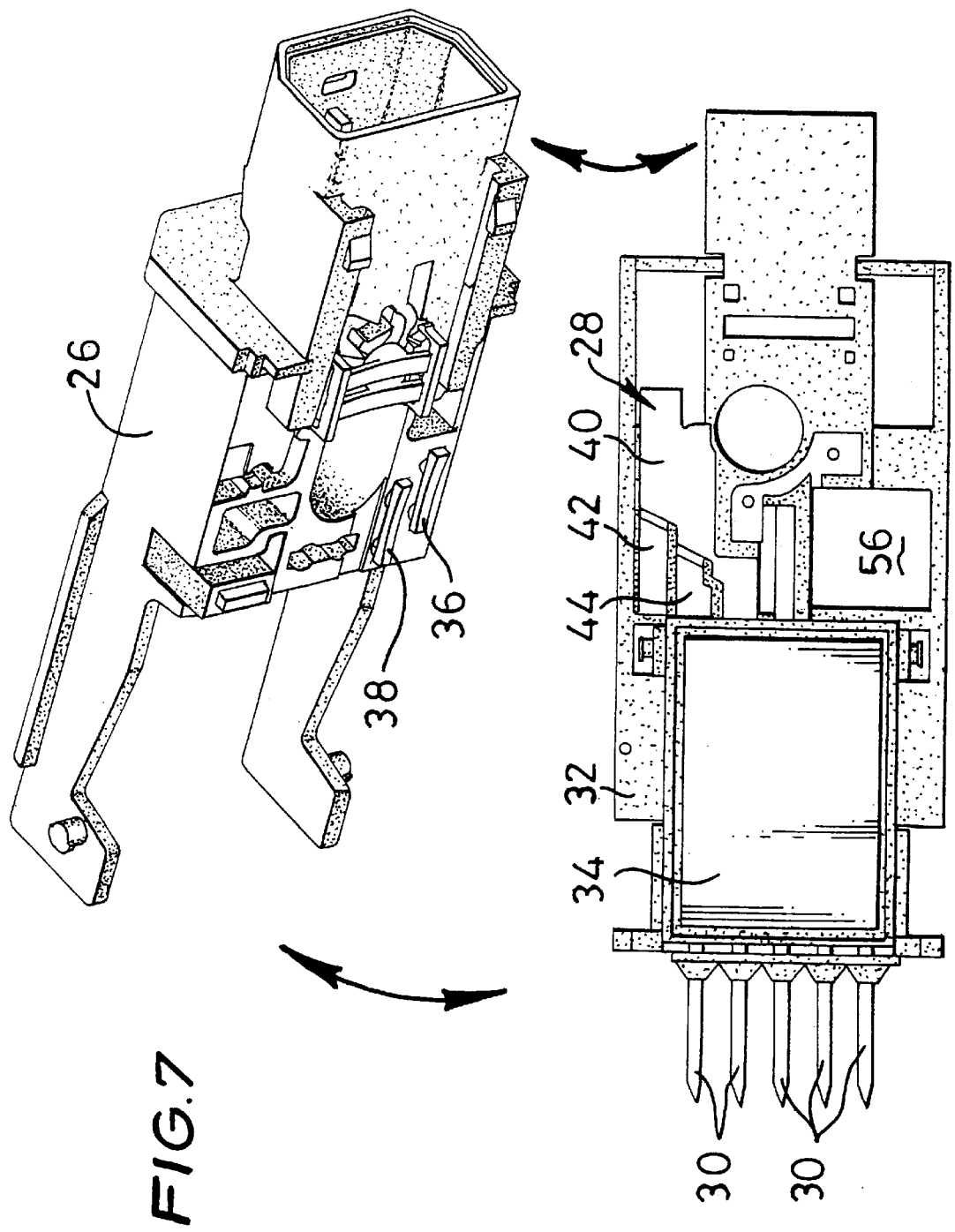
FIG. 7 is a part pictorial view of one of the said two units of FIG. 3 showing the other exploded and in plan.

FIG. 7 shows the contact carrier 26 pictorially and the circuit unit 24 in plan from the side to which the contact carrier 26 is assembled. Thus the circuit unit 24 has a pressing 28 providing male connectors 30 and an electrical circuit supported by a moulding 32. Soldered onto the pressing is a relay 34 to switch the flashers on and off under control of the control circuit 22.

FIG. 5 shows the circuit units 13 and 24 assembled with the moving contact carrier 26 in a housing 66.

The contact carrier 26 carries moving switch contacts one 50 of which can be seen in FIG. 3 projecting through an aperture 52 in the circuit unit 24. In FIG. 3 the circuit unit 13 is shown from the other side to that of FIG. 2. In the side shown in FIG. 3, there is an opening 56 through which areas 58, 60 and 62 of the pressing are exposed. These areas serve as fixed switch contacts. The moving switch contact 50 makes electrical contact with these areas so as to form an electrical connection between area 58 and either area 60 or area 62 depending on whether the sliding carrier 26 is in its normal extended position shown in FIG. 3 or is in its depressed hazard position shown in FIG. 4. The sliding carrier 26 is biased to its normal position by springs 63 on opposite sides of the carrier (only one being visible in FIGS. 3 and 4). A latching mechanism retains the carrier 26 once it has been depressed.

The contact carrier 26 also carries moving switch contacts 36 and 38. These make electrical contact with areas 40, 42 and 44 of the pressing 28 which serve as fixed switch contacts such that when the contact carrier 26 is in its normal extended position, both moving contacts are in electrical contact with the area 40 only. When the moving contact carrier 26 is in its depressed position, the moving contacts 36 and 38 complete an electrical connection between the areas 40, 42 and 44.

Figure 4:
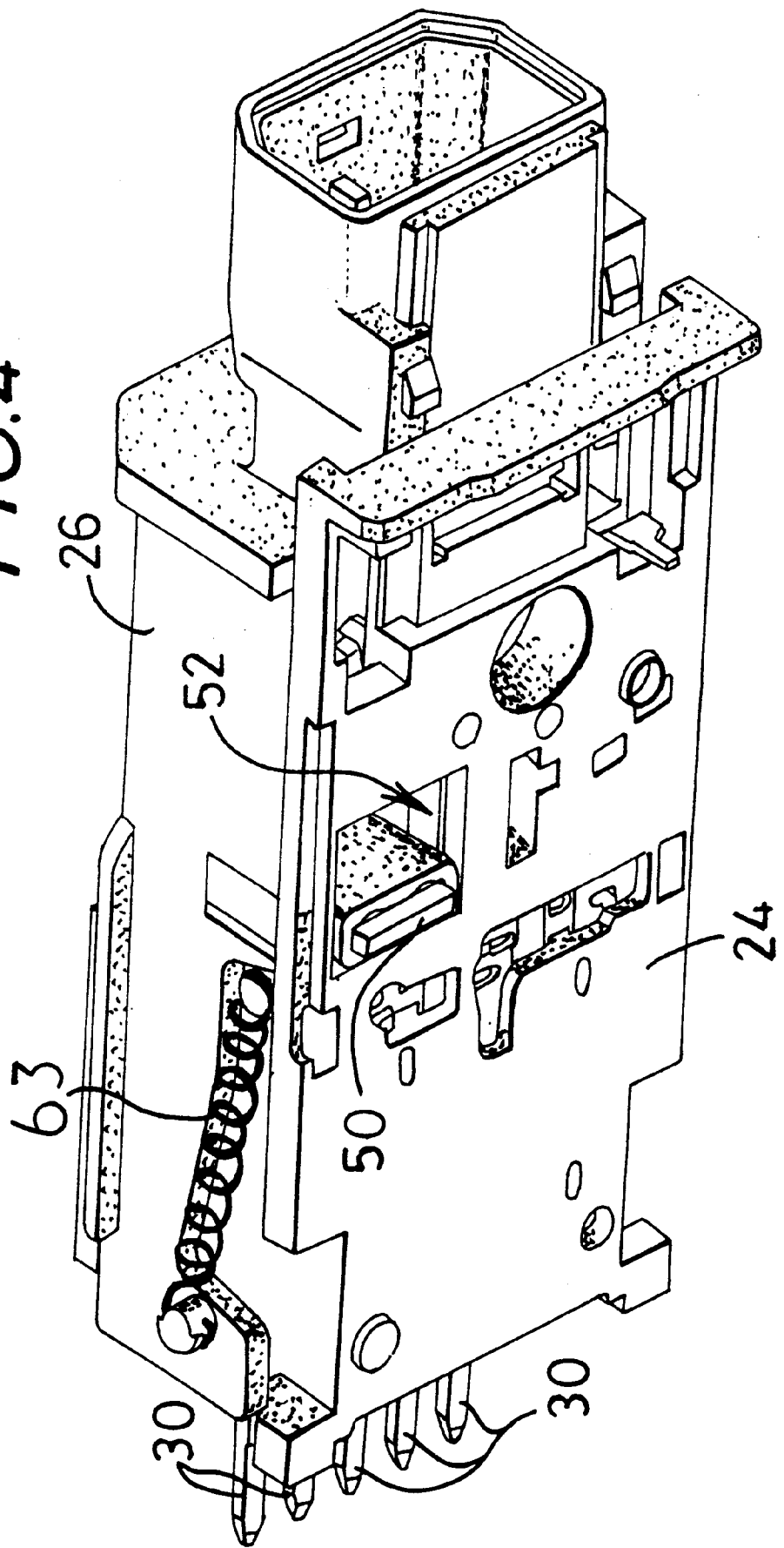
FIG. 4 is a pictorial view of the two units of FIG. 3 showing one depressed.
Figure 8:
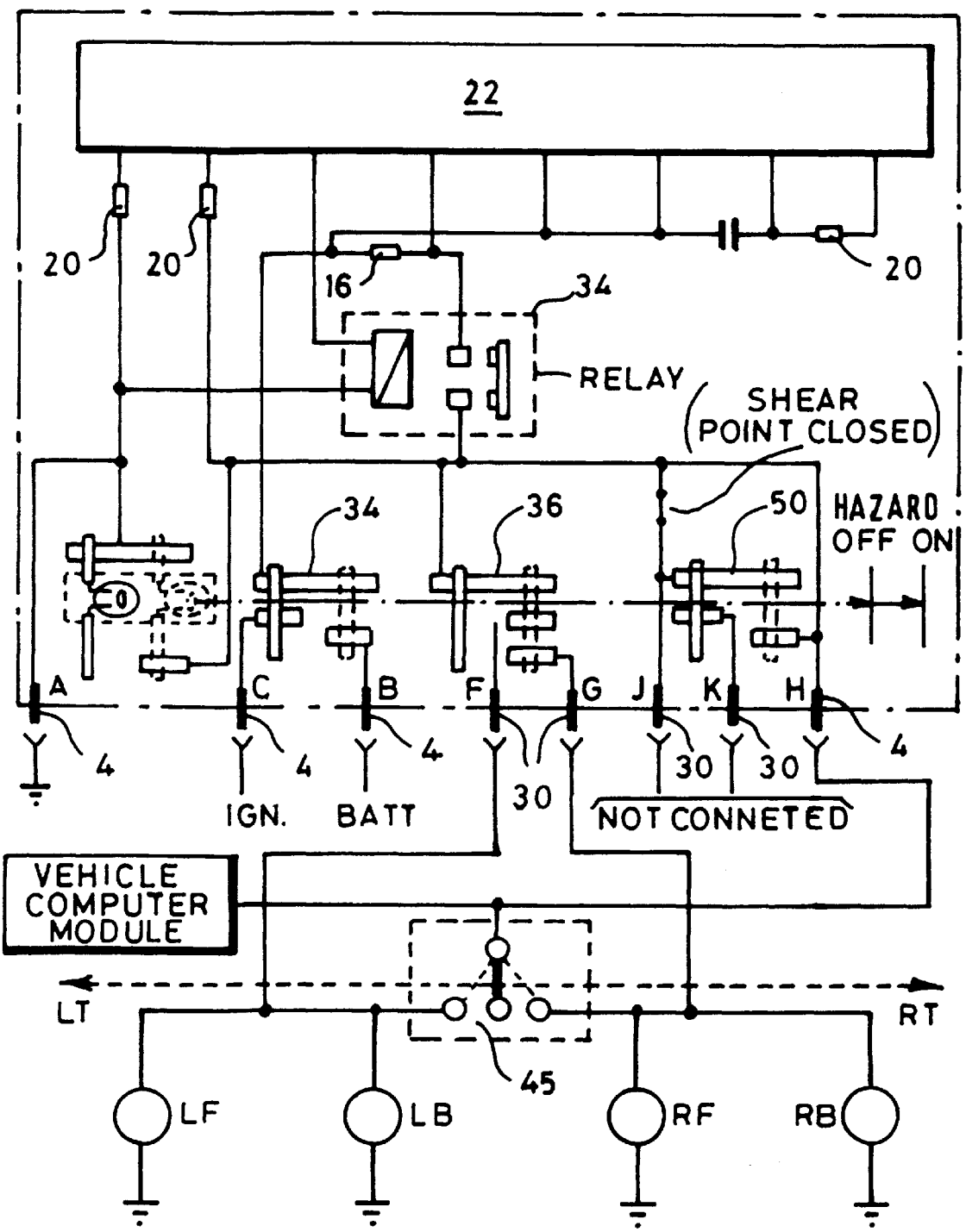
FIG. 8 is a schematic circuit diagram of the combined flasher unit and hazard warning switch and parts of the vehicles electrical circuit.

In the former (normal) position, the switch contacts set the circuit to provide a pulsing output to a direction indicator switch, 45, see FIG. 8, through the wiring loom, not shown, and ones of the connectors 4H so as to operate none of the vehicle's flashers or those LF,LB on the left side of the vehicle or those RF, RB on the right side of the vehicle, controlled by the switch 45. When the moving contact carrier is depressed as shown in FIGS. 4 and 6, by means of a button 64 shown in FIG. 5, the switch contacts set the circuit so as to operate all the vehicle's flashers, i.e. on both sides of the vehicle, at once, via connectors 30F and 30G.

We claim:

1. A hazard warning switch for motor vehicles including turning and hazard warning indicators on opposite sides of the vehicle and an indicator switch for operating indicators on respective sides of the vehicle, the switch being disposed within a single housing containing: hazard warning switch contacts and at least one conductive pressing insert moulded in an insulating support covering both sides of the pressing, the support having openings therein exposing areas of the pressing, and the pressing providing:

an electrical circuit on which are mounted circuit components of a combined hazard and flasher control unit, some of said components being exposed through openings in the support;

connector terminals for connection to terminals in the vehicle, to provide electrical power to the hazard warning and indicator switches;

electrical connectors to operate the indicators on respective sides of the vehicle under control of the indicator switch; and connections to the hazard warning switch contacts to set the circuit to operate the indicators on both sides of the vehicle as a hazard warning.

2. A hazard warning switch as claimed in claim 1, wherein the connector terminals also provide connections to a separate indicator switch.

3. A hazard warning switch as claimed in claim 1, wherein the said components include a surface mounted integrated circuit.

4. A hazard warning switch as claimed in claim 1, wherein the pressing provides switch contacts.

5. A hazard warning switch as claimed in claim 1 wherein said pressing comprises a metal sheet embedded within aid support, the sheet including a plurality of spaced part conductive areas some of which are exposed through openings in said support.

6. A hazard warning switch as claimed in claim 5 wherein others of said first conductive areas extend outwardly from said support for providing said connector terminals.

7. A hazard warning switch as claimed in claim 6 wherein one of said components comprises an integrated circuit extending through one of said support openings and solder bonded to conductive areas exposed through said one opening.

8. A hazard warning switch according to claim 6 including a switch member mounted for movement relative to said support, said member including an electrical contact extending through one of said openings exposing two spaced apart contact areas for respective contacting by said electrical contact dependent upon the movement of said member relative to said support.

9. A hazard warning switch according to claim 3 wherein said integrated circuit includes terminals extending towards a generally flat surface of said pressing, said terminals ending at said surface without penetration therethrough and being mechanically and electrically bonded to said pressing at said surface.

10. A hazard warning switch for motor vehicles comprising first and second pressings each inset molded in an insulating plastics support, each of said pressings providing an electrical circuit including groups of spaced apart but electrically connected flat metal plates, said first and second pressings being fixedly secured together in parallel, overlapping and electrically separated relationship, a component of a combined hazard and flasher control unit mounted on a respective first plate of each of said pressings, said first plates of each of said pressings being electrically connected to a respective second plate of each said pressings, said second plates serving as respective terminals for each of said components, and a contact carrier mounted on said first pressing for movement relative to said pressings, said carrier carrying first and second contacts for selective contacting of spaced apart third plates of said first and second pressings, respectively, dependent upon the position of said carrier relative to said pressings.

11. A hazard warning switch according to claim 10 wherein said carrier second contact extends through a first opening through said first pressing for contacting said spaced apart third plates of said second pressing.

12. A hazard warning switch according to claim 11 wherein a side of the plastics support of said second pressing facing in a direction away from said first pressing has a second opening therethrough exposing a plurality of adjacent first plates of said pressing, and an integrated circuit extending through said second opening and being mounted on said adjacent first plates.

13. A hazard warning switch for a motor vehicle, having indicators on opposite sides of the vehicle for indicating, when only indicators on one side of the vehicle are activated, direction of turning, or, when all of said indicators are activated, a hazard warning, and the vehicle including an indicator switch for activating indicators on respective sides of the vehicle, the hazard warning switch being disposed within a single housing and including a first segmented conductive pressing, inset moulded in a first insulating structure covering both sides of the pressing, the support structure having openings therein exposing areas of the pressing, the pressing support providing a first electrical circuit on which are mounted first circuit components of a combined hazard and flasher control unit for generating electrical signals for activating one or more of said indicators when said signals are applied thereto, one of said openings exposing a portion of said pressing for external access to said portion for the mounting, through said one opening, of a component on said pressing portion, the pressing also providing:

a) connector terminals for connection to terminals in the vehicle for providing electrical power to the hazard warning switch and to the indicator switch;

b) electrical connections for connecting said electrical signals to selected indicators for directional signaling under control of said indicator switch; and c) connections to first switch contacts on said pressing for connecting said electrical signals to all of said indicators for hazard warning signaling under control of a switching member forming part of said hazard warning switch and movable relative to said pressing.

14. A hazard warning switch according to claim 13 wherein the connector terminals provide connections to an indicator switch separate from the hazard warning switch.

15. A hazard warning switch according to claim 14 including a second segmented conductive pressing, inset moulded in a second insulating plastics support, providing a second electrical circuit on which are mounted second circuit components of said control unit, said first and second supports being fixedly secured together for disposing said first and second pressings in parallel, overlapping and electrically separated relationship, said switching member being mounted on said first support for movement relative to said pressings and being accessible within said vehicle for manual operation for providing said hazard warning signaling, and said switching member including second switch contacts for selective contact with said first switch contacts dependent upon the position of said switching member relative to said pressings.

16. A hazard warning switch according to claim 15 wherein said switching member includes a first surface for linear movements adjacent to a second surface of said first support on which said switching member is mounted, said first and second supports embedding said first and second pressings therein, respectively, and said first support second surface including an opening therethrough exposing first switch contacts of said first pressing for selective contact with a second switch contact extending from said switching member first surface.

17. A hazard warning switch according to claim 16 wherein said first support is disposed between said switching member first surface and a third surface of said second pressing facing towards said switching member first surface, and said first support includes an opening entirely therethrough overlying an opening in the third surface of said second support exposing a third switch contact provided by said second pressing for selective contact with a fourth switch contact extending entirely through said first support from said switching member first surface.

18. A hazard warning switch according to claim 17 wherein said first support includes an extending plate secured to said switching member in sliding relationship along linear directions generally parallel to said first and second surfaces of said switching member and said first support, respectively.

19. A hazard warning switch according to claim 18 including a biasing member for biasing said switching member relative to said pressings such that, except when said switch is manually operated for providing hazard warning signaling, said electrical signals are fixedly routed only to said indicator switch.

* * * * *